United States Patent [19]
Kent

[11] Patent Number: 6,130,016
[45] Date of Patent: Oct. 10, 2000

[54] METHOD FOR FORMING SEMICONDUCTOR STRUCTURES USING A CALIBRATING RETICLE

[75] Inventor: Eric R. Kent, San Jose, Calif.

[73] Assignee: Advanced Micro Devices, Inc., Sunnyvale, Calif.

[21] Appl. No.: 09/288,688

[22] Filed: Apr. 9, 1999

[51] Int. Cl.[7] ...................................................... G03F 9/00
[52] U.S. Cl. .................. 430/30; 430/5; 356/124
[58] Field of Search ........................... 430/5, 30; 356/124

[56] References Cited

U.S. PATENT DOCUMENTS 5,801,821  9/1998  Borodovsky ............................ 356/124

*Primary Examiner*—Christopher G. Young

[57] ABSTRACT

A device and method to prepare a stepper to form semiconductor structure lines by using a calibration reticle to determine optimum numerical aperture and partial coherence values for the stepper. The calibration reticle includes a light-transmissive substrate having a plurality of patterns disposed thereon, each of the plurality of patterns including a series of structures of a constant size spaced an equal distance from one another and having a predetermined pitch intended to mimic a pitch value of a semiconductor structure reticle. The method includes positioning the calibration reticle on a stepper and optimizing the performance characteristics (e.g., the partial coherence value and the numerical aperture value) of the stepper using one of the patterns of the calibration reticle corresponding to a predetermined pitch of a semiconductor structure reticle.

22 Claims, 5 Drawing Sheets

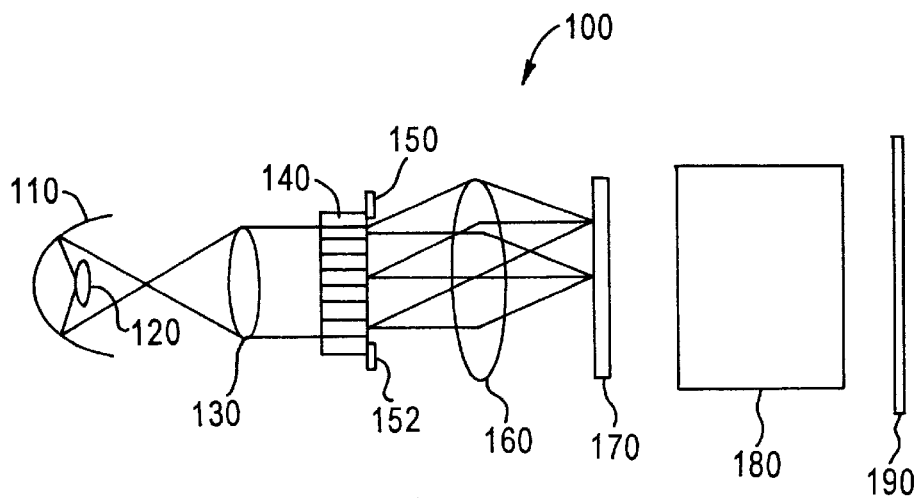
FIG. 2
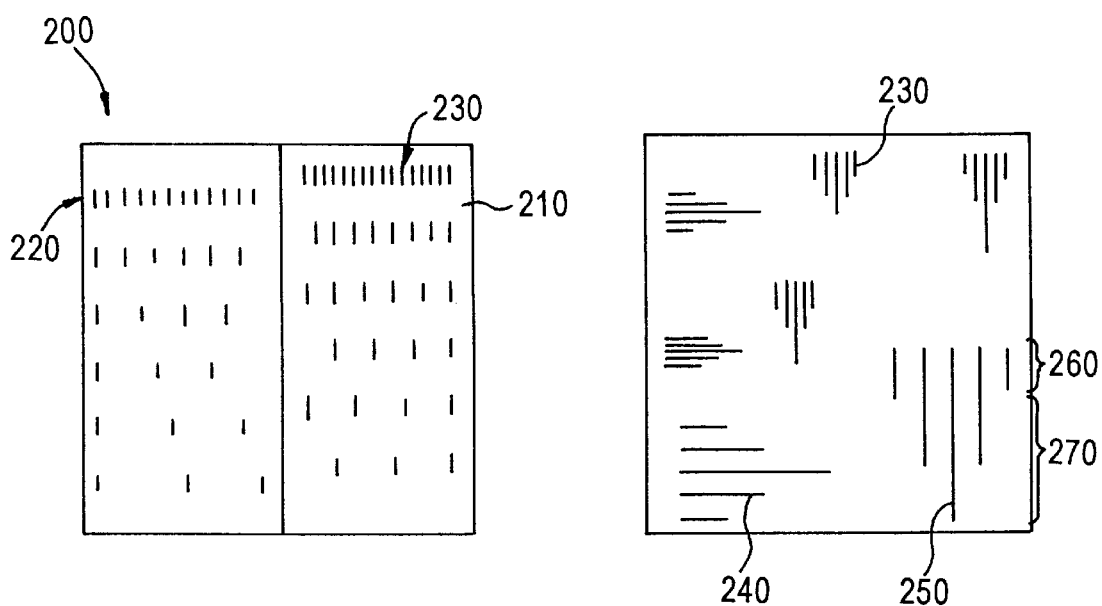
FIG. 3A
FIG. 3B

METHOD FOR FORMING SEMICONDUCTOR STRUCTURES USING A CALIBRATING RETICLE

FIELD OF THE INVENTION

The present invention relates to high-density semiconductor devices, and in particular, to a calibrating reticle and photolithographic method of using a calibrating reticle to determine optimum numerical aperture and partial coherence values for a stepper.

BACKGROUND OF THE INVENTION

In the field of semiconductor devices the desire to achieve faster devices entails the fabrication of smaller and smaller devices. As device characteristics get smaller it becomes increasingly more important to control linewidth variation in lithographic patterning.

Linewidth variation, depending upon the severity, can cause a device to have poor performance or cause the device to fail altogether. For example, linewidth variation in the patterning of gate layers can cause the gate to be formed too large or too small. Larger gates slow down the semiconductor device such that the device has poor performance. Smaller gates are faster, however, if a gate is too small (i.e., smaller than required by the specific design characteristics) it may result in punch-through, which ultimately causes device failure. Linewidth variation may also cause or amplify alignment problems for semiconductor structures that require precise alignment in order to function properly, such as contact holes and implant layers.

As linewidths are decreased, the photolithography processing used to form the structure has a significant effect on linewidth variation. As illustrated in FIG. 1A, a metal layer 20 is formed on a substrate 10. A layer of photoresist 30 is formed on the metal layer 20 and a reticle 40, having a pattern corresponding to the structures to be formed, is placed in a stepper and aligned with respect to substrate 10. Light is then directed through reticle 40 exposing photoresist 30, which is subsequently developed to form a photoresist layer with openings corresponding to portions of metal layer 20 to be etched away. Etching is then conducted to form structures 51–54, as depicted in FIG. 1B. Disadvantageously, although all the structures 51–54 have the same design width ($W_{des}$), their actual width $W_1$–$W_4$ typically differ to a considerable extent. Such variations in linewidth ultimately leads to a reduction in circuit speed as designers intentionally increase the mean linewidth above the optimum linewidth to avoid yield loss resulting from linewidths below a lower limit based upon performance constraints at the expense of circuit speed and performance.

It is believed that a major factor causing such linewidth variation is the position of the structures relative to each other, known as "line density." Some lines, such as structures 52–54, are relatively closely spaced apart; e.g., less than about 1 micron, and are referred to as "dense lines." Other lines, such as structure 51, are relatively remote; e.g., greater than 1 micron, and are referred to as "isolated lines." Isolated lines tend to have different widths than dense lines formed at the same time. It is believed that this phenomenon occurs because interference occurs between neighboring patterns on reticle 40, affecting final linewidth when the dimensions of a neighboring line is of the order of the wavelength of light used during the photolithography process (i.e., the light used to expose photoresist 30). However, in the case of an isolated line, no such interference occurs. Referring again to FIG. 1B, an isolated structure such as 51 typically has a length $W_1$ larger than the $W_2$–$W_4$ of dense structures 52–54. In addition, structures 52 and 54 typically have lengths $W_2$, $W_4$, which are about equal, since their pattern density is the same. However, structure 53 typically has a length $W_3$ less than $W_2$ and $W_4$.

Linewidth variation can be caused by many sources. One source, for example, is the optical proximity effect. The optical proximity effect causes systematic linewidth differences between "isolated" features and "dense" or "nested" features. The phrase "isolated features" is used to describe lines that are not in the presence of or are not surrounded by other lines with similar features are thus isolated. The phrase "nested features" is used to describe lines that are in the presence of or surrounded by other lines with similar features and are thus "nested" or "grouped." When isolated and nested features are patterned on the wafer using commercially available stepping or scanning microlithographic equipment, linewidth variance occurs even though the size of the isolated and nested features on the reticle are the same. There are several methods to reduce the optical proximity effect and improve linewidth control.

One method to improve linewidth control is to select a lithographic process that does not exhibit significant optical proximity effects, such as negative tone patterning. In negative tone patterning the portions of the resist exposed to light become insoluble. These insoluble portions remain behind and act as an etch mask to protect the underlying layer that will form the lines or gates being patterned. Although not well understood, it is a known empirical fact to those skilled in the art, that negative tone patterning exhibits a much smaller degree of optical proximity effects than positive tone patterning. The pattern media, i.e., "dark" field reticles and negative resist, used in negative tone patterning exhibit a much smaller degree of optical proximity effects than the more widely used pattern media, "clear" field reticle and positive resists, of positive tone patterning.

Although negative tone patterning is advantageous due to its lack of optical proximity effects, negative tone patterning also has many disadvantages that have made positive tone patterning more desirable for the last several generations of microphotolithography, for example, generations with device features below 1.50 microns. One such disadvantage is that negative resists tend to exhibit a mechanism known as swelling. That is, negative resists increase in volume, or "swell," as a result of penetration of the material by the developer solution. Such swelling causes the feature size of the pattern created in the resist to be altered. As an example, for design features smaller than 3 $\mu$m, the change in feature size is unacceptably large compared to the specified dimensions. Positive resists do not exhibit swelling, due to a different dissolution mechanism during development of the resist, and are therefore desirable for design features smaller than 3 $\mu$m.

Scumming effects are another disadvantage of negative resists. Scumming effects are caused when radiation, scattered off the projection optics, crosslinks a thin layer in the top surface of a negative resist and the thin layer becomes punctured and slides down between the features. As little as 1% scattered light has been observed to produce this unwanted mechanism in negative tone patterning. In positive tone patterning, such scattered light only results in a slight reduction of resist thickness, and no scumming effect is produced. As a result of swelling and scumming, there are no commercially available high performance negative tone resists for microlithographic patterning of the gate layers for the more recent generations of semiconductor devices. More recent generations of gate layers have dimensions, for example, below 0.8 μm, and require exposure tools with an exposure wavelength of, for example, approximately 365 nm.

Another way to reduce linewidth differences caused by optical proximity effects is to increase the value of the exposure tool partial coherence (σ) employed in positive tone patterning. Partial coherence (σ) of the lithographic equipment is defined as the ratio of the illuminator numerical aperture to the numerical aperture of the projection optics. There is a complex relationship between the partial coherence of the exposure tool and the ability of the exposure tool to pattern and control the linewidth of minimal features of the different kinds of device layers over varying process conditions. The optimization of the partial coherence value for a given linewidth or pitch of a reticle is conventionally a time consuming endeavor. Common practice involves performing a series of experiments on each new reticle in order to optimize the partial coherence setting on the lithographic equipment for that particular reticle.

Thus, what is needed is a device and method that provides for the reduction of linewidth differences caused by optical proximity effects by optimizing the partial coherence value of the lithographic equipment in an efficient manner. The device and method should provide for the formation of semiconductor structures, such as interconnect lines or back-end metal lines, active lines, metal lines, contact holes, and implant layers, using any type of patterning material.

SUMMARY OF THE INVENTION

The present invention provides a device and method to prepare a stepper to form semiconductor structures by using a calibration reticle to determine optimum numerical aperture and partial coherence values for the stepper. The present invention achieves this result by using a calibration reticle to form a test pattern based upon a predetermined pitch of a semiconductor structure reticle and varying the numerical aperture and partial coherence settings of the stepper until the linewidth of the test pattern is optimized.

The present invention advantageously provides an embodiment of a calibration reticle used in performing the method of the present invention that includes a light-transmissive substrate having a plurality of patterns disposed thereon. Each of the plurality of patterns includes a series of structures of a constant size spaced an equal distance from one another. An exemplary embodiment of the present invention includes lines of equal thickness as the structures that are spaced to give each of the plurality of patterns a predetermined pitch, one of which is intended to mimic a pitch value of a semiconductor structure reticle.

The present invention also advantageously provides a method for preparing a stepper to form semiconductor structures by using a calibration reticle to determine optimum numerical aperture and partial coherence values for the stepper. The method of the present invention includes positioning a calibration reticle having a plurality of patterns of a predetermined pitch on a stepper and optimizing the performance characteristics (e.g., the partial coherence value and the numerical aperture value) of the stepper using one of the patterns of the calibration reticle corresponding to a predetermined pitch of a semiconductor structure reticle. Then an optional step can be performed in which the optimization process is repeated for any remaining patterns on the calibration reticle so that those results can be saved for future reference. A semiconductor structure reticle is then positioned on the stepper and used at optimum performance characteristics of the stepper to form a semiconductor structure mask on a metal (or other patterning material) layer. The metal layer is then etched using the semiconductor structure mask to form a semiconductor structure layer.

The step of optimizing the performance characteristics of the stepper can be performed using several different methods according to the invention. A first exemplary embodiment of optimizing the performance characteristics of the stepper includes forming a test mask on a test metal layer using one of the patterns on the calibration reticle that corresponds to a predetermined pitch of a semiconductor structure reticle, and etching the metal layer using the test mask to form a test pattern. The test pattern is analyzed to determine if a linewidth of the test pattern is optimized and, if so, the performance characteristics of the stepper so that those characteristics may be used with the semiconductor structure reticle. If the linewidth is not optimized, then the performance characteristics of the stepper are adjusted and the above steps are repeated until the linewidth of the test pattern is optimized.

A second exemplary embodiment of optimizing the performance characteristics of the stepper includes forming a matrix of test masks on a test metal layer using one of the patterns on the calibration reticle that corresponds to a predetermined pitch of a semiconductor structure reticle. The matrix of test masks is formed by positioning the calibration reticle at a first position using the stepper set at predetermined performance characteristics and moving the calibration reticle to a second position while varying the performance characteristics of the stepper and repeating this process. Once the matrix of test masks is formed, a metal layer is etched using the matrix of test masks to form a matrix of test patterns. The matrix of test patterns is analyzed to determine which of the test patterns has an optimized linewidth, and to determine the performance characteristics of the stepper that correspond to the optimized test pattern so that those characteristics may be used with the semiconductor structure reticle.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

BRIEF DESCRIPTION OF THE DRAWINGS

FIG. 2 illustrates a conventional illuminator arrangement.

FIG. 3A is a top plan view of a first exemplary embodiment of a calibration reticle according to the present invention.

FIG. 3B is a top plan view of a second exemplary embodiment of a calibration reticle according to the present invention.

DETAILED DESCRIPTION OF THE INVENTION

Figure 1A:
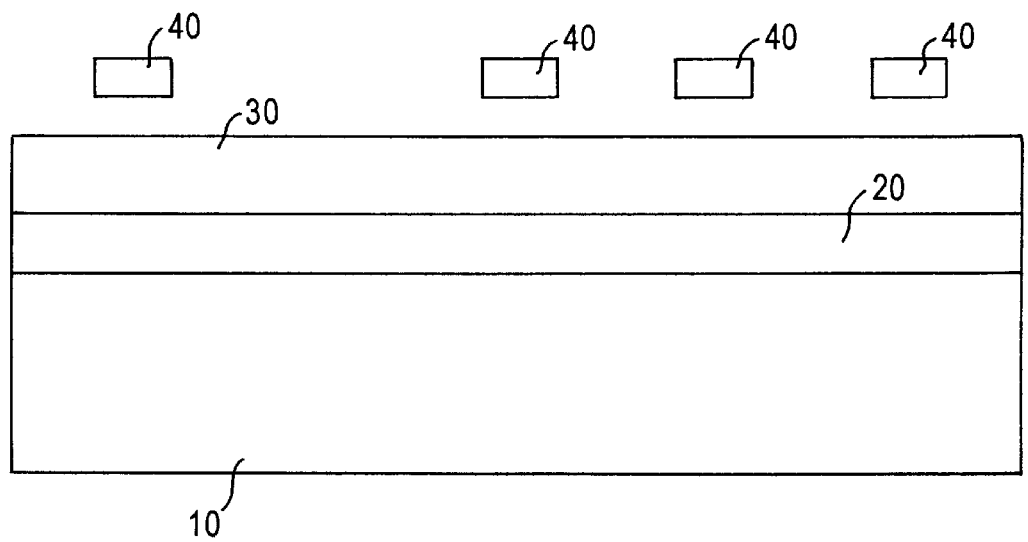
FIG. 1A is a cross-sectional view of a semiconductor device including a substrate, a metal layer, a photoresist layer, and a reticle used to form exemplary semiconductor structures.
Figure 1B:
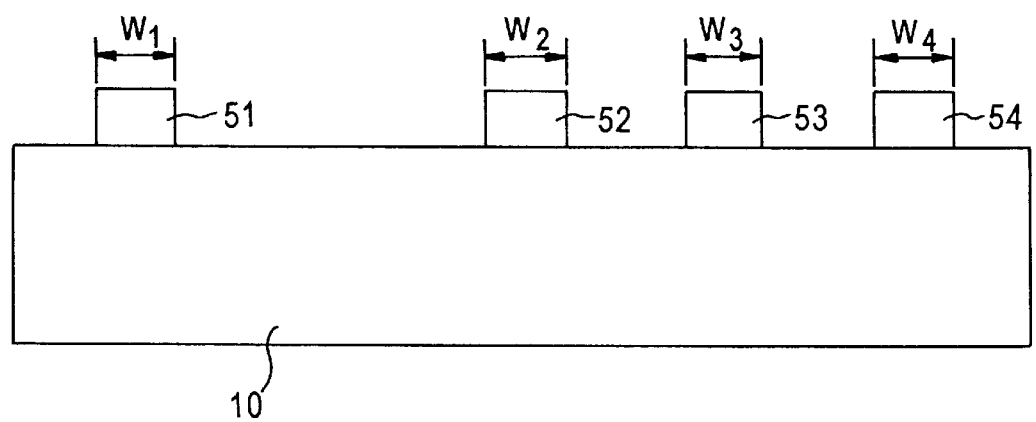
FIG. 1B is a cross-sectional view of the semiconductor device of FIG. 1A where a plurality of semiconductor structures is formed on the substrate.

To understand the present invention more fully, a brief description of a conventional illuminator arrangement is described below in conjunction with FIG. 2.

FIG. 2 illustrates a conventional stepper or illuminator arrangement 100. Radiation concentrator 110, such as an elliptical mirror, reflects energy emitted by radiation source 120 into the entrance pupil of the illuminator, i.e., input lens 130. The illuminator of the exposure tool may employ intensity randomizer 140, which randomizes the intensity of the radiation in the illuminator. Intensity randomizer 140, for example a fly-eye lens, is used in the microlithography exposure tool illuminator in order to insure light intensity uniformity in the projection lens entrance. The exposure tool illuminator may also employ a partial coherence aperture 150, which reduces the undesirable impact of the peripheral regions of the intensity randomizer on the uniformity of the illumination.

The physical size of the randomizer 140 or the size of the opening in the partial coherence aperture 150 define the area (size) of the effective light source of the projection system that is used to form the image of reticle 170 on wafer 190. Condenser lens 160 focuses the effective light source onto the entrance pupil of projection lens 180. Projection lens 180 projects the pattern contained in reticle 170 onto the photoresist layer of the wafer 190. It is the condition of the spatial coherence across the final image field of the projection lens 180 that can result in large across field linewidth nonuniformity.

When a new reticle is received by an operator of the illuminator arrangement 100, the operator must typically perform a series of steps in order to prepare the stepper for optimum performance. The operator must perform an experiment for each new reticle in order to determine the optimum settings for the illuminator arrangement 100 based on the pitch of the new reticle. The experiment typically includes steps in which the reticle is used to form patterns while the partial coherence and numerical aperture values of the illuminator arrangement 100 are varied. The operator then determines which partial coherence and numerical aperture values produced the optimum pattern. In other words, the operator must determine which partial coherence and numerical aperture characteristics resulted in a pattern that most closely related to a pattern on the reticle. As the optimum partial coherence and numerical aperture values differ depending on the pitch of the pattern on the reticle, and since reticles have a broad range of pitch values, the optimum partial coherence and numerical aperture values must be obtained for each new reticle that is used with the illuminator apparatus.

The optimization of the illuminator arrangement 100 for each new reticle is a time consuming task that can take as long as a few days per reticle. Any delay in the production process is extremely detrimental to the cost effectiveness of the process. The present invention allows an operator to optimize the stepper or illuminator arrangement 100 prior to the receipt of a new reticle, based upon a predetermined knowledge of the new reticle's pitch. The present invention can also allow the operator to save the optimized values for various pitches for future reference. More specifically, the present invention provides a device and method to prepare a stepper to form semiconductor structures, for example, local interconnect lines or backend metal lines, active lines, metal lines, contact holes, and implant layers, by using a calibration reticle to determine optimum numerical aperture and partial coherence values for the stepper. The present invention achieves this result by using a calibration reticle in conjunction with an illuminator arrangement, for example the illuminator arrangement 100 depicted in FIG. 2, to form a test pattern based upon a predetermined pitch of a semiconductor structure reticle, and varying the numerical aperture and partial coherence settings of the stepper until the linewidth of the test pattern is optimized.

FIG. 3A depicts a first exemplary embodiment of a calibration reticle 200 according to the present invention. The calibration reticle 200 of the present invention includes a light-transmissive substrate 210 having a plurality of patterns 220 disposed thereon. Each of the plurality of patterns 220 includes a series of structures 230 of a constant size spaced an equal distance from one another. The exemplary embodiment depicted in FIG. 3A includes lines of equal thickness as the structures 230. The exemplary embodiment has line structures 230 that are spaced to give each of the plurality of patterns 220 a predetermined pitch, one of which is intended to mimic a pitch value of a semiconductor structure reticle. The structures 230 of the calibration reticle 200 can be in the shape of any other type of semiconductor structure formed using a reticle as will be readily apparent to one of ordinary skill in the art. The exemplary embodiment of the calibration reticle 200 depicted in FIG. 3A also has the plurality of patterns 220 arranged in a predetermined arrangement of rows. The plurality of patterns can be arranged in a vast variety of different arrangements as will be readily apparent to one of ordinary skill in the art. FIG. 3B depicts a second exemplary embodiment of a calibration reticle according to the present invention. The second exemplary embodiment includes horizontal structures 240 and vertical structures 250 that are generally perpendicular to one another and of varying pitch and pattern density. Each of the horizontal and vertical structures, 240 and 250, includes a relatively dense end 260 and a relatively isolated end 270 due to the generally triangular shaped arrangement of structures 230 of varying lengths.

Figure 4A:
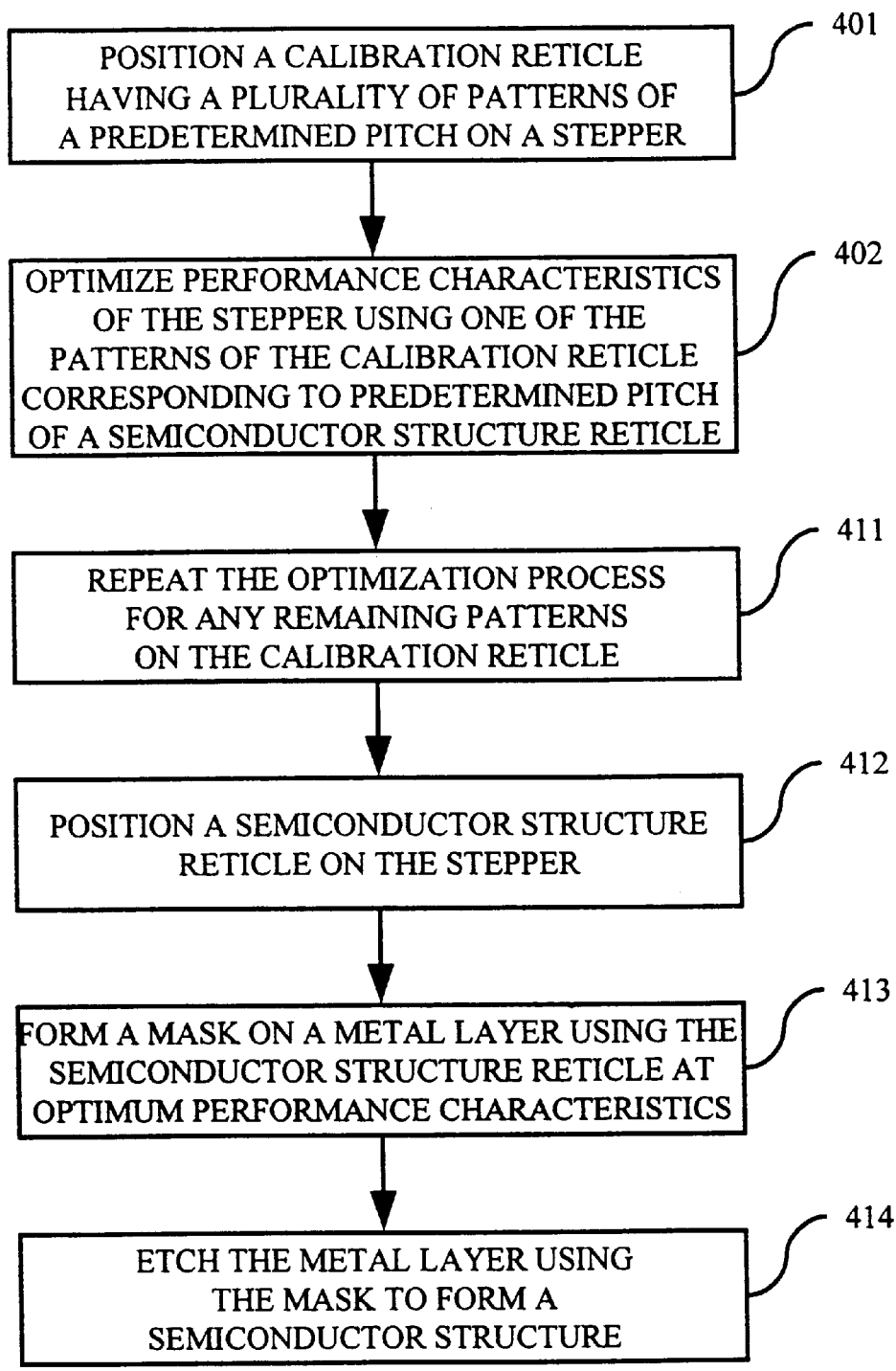
FIG. 4A is a flowchart of a method for preparing a stepper to form semiconductor structures by using a calibration reticle to determine optimum numerical aperture and partial coherence values for the stepper according to the present invention.
Figure 4B:
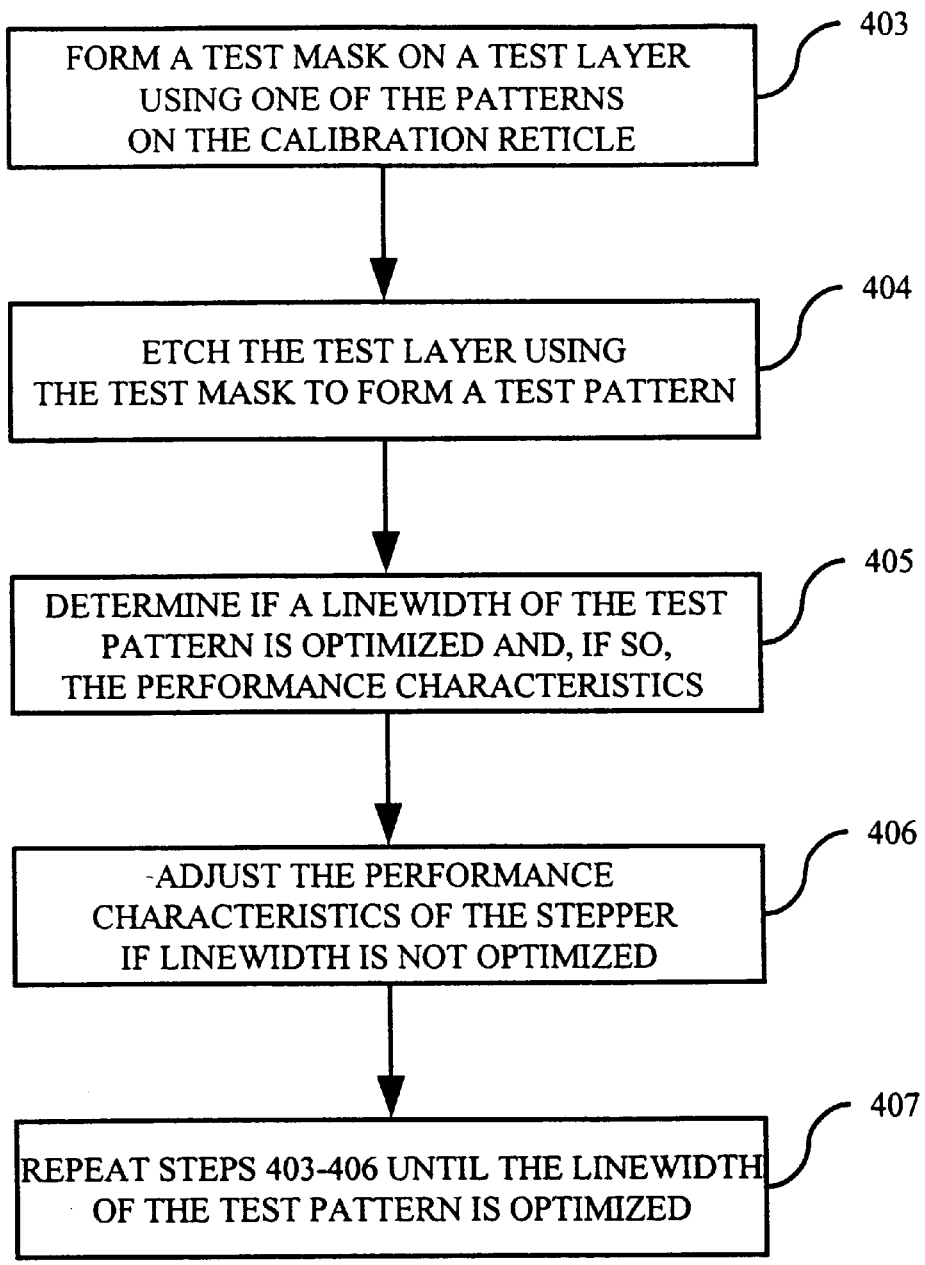
FIG. 4B is a flowchart of a first exemplary embodiment of one of the steps of FIG. 4A.
Figure 4C:
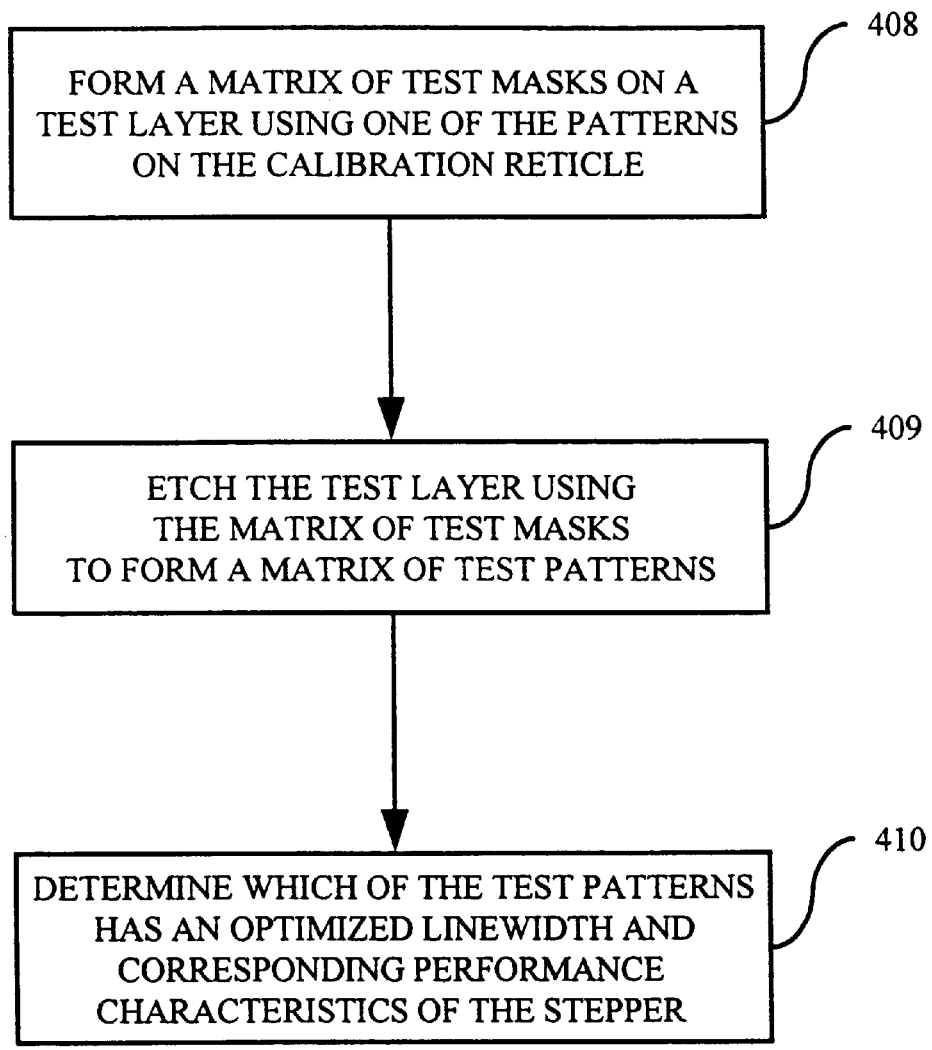
FIG. 4C is a flowchart of a second exemplary embodiment of one of the steps of FIG. 4A.

FIGS. 4A–4C are flowcharts setting forth a method for preparing a stepper to form semiconductor structures by using a calibration reticle to determine optimum numerical aperture and partial coherence values for the stepper according to the present invention. FIGS. 4A and 4B describe a first exemplary embodiment of the method of the present invention, and FIGS. 4A and 4C describe a second exemplary embodiment of the method of the present invention.

FIG. 4A sets forth a step 401 of positioning a calibration reticle having a plurality of patterns of a predetermined pitch on a stepper. Step 402 includes optimizing the performance characteristics (e.g., the partial coherence value and the numerical aperture value) of the stepper using one of the patterns of the calibration reticle corresponding to a predetermined pitch of a semiconductor structure reticle. Step 402 can be performed using several different methods, two of which are explained in detail below with reference to FIGS. 4B and 4C. Then an optional step 411 can be performed in which the optimization process of step 402 is repeated for any remaining patterns on the calibration reticle so that those results can be saved for future reference. Step 412 includes positioning a semiconductor structure reticle on the stepper. In step 413 the semiconductor structure reticle is used at optimum performance characteristics of the stepper to form a semiconductor structure mask on a metal, or other patterning material, layer. The mask is formed by directing light through the reticle and exposing a photoresist on the metal layer, which is subsequently developed to form photoresist layer or mask with openings corresponding to portions of the metal layer to be etched away. In step 414 the metal layer is etched using the semiconductor structure mask to form a semiconductor structure layer.

A flowchart of the first exemplary embodiment of optimizing the performance characteristics of the stepper is set forth in FIG. 4B. In the first exemplary embodiment step 402 includes steps 403 through 407. Step 403 includes forming a test mask on a test metal layer using one of the patterns on the calibration reticle that corresponds to a predetermined pitch of a semiconductor structure reticle. The test mask is formed by directing light through the calibration reticle and exposing a photoresist on the test metal layer, which is subsequently developed to form a test photoresist layer or test mask with openings corresponding to portions of the test metal layer to be etched away. In step 404 the metal layer is etched using the test mask to form a test pattern. In step 405 the test pattern is analyzed to determine if a linewidth of the test pattern is optimized and, if so, the performance characteristics of the stepper so that those characteristics may be used with the semiconductor structure reticle. The linewidth of the test pattern is optimized if it is substantially identical to or identical to the predetermined pitch value of the pattern on the calibration reticle corresponding to the predetermined pitch of the semiconductor structure reticle. Whether the linewidth of the test pattern is substantially identical to or identical to the predetermined pitch value depends on such factors as the clarity of the test pattern, and the size and shape of the test pattern compared to the pattern on the calibration reticle used to form the test pattern. If the linewidth is not optimized, then step 406 includes adjusting the performance characteristics of the stepper, such as either or both the partial coherence value and the numerical aperture of the stepper. Step 407 includes repeating steps 403 through 406 until the linewidth of the test pattern is optimized.

Note that the optimal partial coherence and numerical aperture values will be different for different resist thicknesses. Therefore, if the resist thickness is changed, then the process must be repeated at that new thickness.

The second exemplary embodiment of the calibration reticle depicted in FIG. 3B allows for the optimization of the linewidth in both a horizontal and a vertical bias using the horizontal and vertical structures, 240 and 250. Preferably the linewidth is equally optimized both horizontally and vertically for a given semiconductor structure.

A flowchart of the second exemplary embodiment of optimizing the performance characteristics of the stepper is set forth in FIG. 4C. In the second exemplary embodiment step 402 includes steps 408 through 410. Step 408 includes forming a matrix of test masks on a test metal layer using one of the patterns on the calibration reticle that corresponds to a predetermined pitch of a semiconductor structure reticle. The matrix of test masks is formed by positioning the calibration reticle at a first position using the stepper set at predetermined performance characteristics and directing light through the calibration reticle to expose a photoresist on the test metal layer. Then the stepper moves the calibration reticle to a second position, varies the performance characteristics of the stepper and again directs light through the calibration reticle to expose a photoresist on the test metal layer. This process is repeated until a matrix of positions on the photoresist have been exposed to light through the calibration reticle. The matrix of positions may be designed to provide a systematic grid of test masks having predetermined partial coherence values and numerical aperture values so that the results of the test matrix can be easily evaluated.

Once the matrix of positions have been exposed to light, the photoresist is subsequently developed to form a matrix of test photoresist layers or test masks with openings corresponding to portions of the test metal layer to be etched away. In step 409 the metal layer is etched using the matrix of test masks to form a matrix of test patterns. In step 410 the matrix of test patterns is analyzed to determine which of the test patterns has an optimized linewidth, and to determine the performance characteristics of the stepper that correspond to the optimized test pattern so that those characteristics may be used with the semiconductor structure reticle. As described above, the linewidth of the test pattern is optimized if it is substantially identical to or identical to the predetermined pitch value of the pattern on the calibration reticle corresponding to the predetermined pitch of the semiconductor structure reticle. It may be necessary to repeat steps 408 through 410 if a test pattern having an optimized linewidth is not produced.

The device and method of the present invention provides for the formation of semiconductor structures, such as interconnect lines or backend metal lines, active lines, metal lines, contact holes, and implant layers, using any type of patterning material, such as nitride, oxide, copper, aluminum, and polysilicon.

The present invention provides a device and method to prepare a stepper to form semiconductor structures by using a calibration reticle to determine optimum numerical aperture and partial coherence values for the stepper. The present invention advantageously allows an operator to optimize the stepper prior to the receipt of a new reticle, based upon a predetermined knowledge of the new reticle's pitch. The invention can also allow the operator to save the optimized values for various pitches for future reference.

In the previous descriptions, numerous specific details are set forth, such as specific materials, structures, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method for preparing a stepper to form semiconductor structures by using a calibration reticle to determine optimum numerical aperture and partial coherence values for the stepper, said method comprising the steps of:

(a) positioning a calibration reticle on the stepper, the calibration reticle comprising a plurality of patterns disposed on a light-transmissive substrate, the plurality of patterns each having a different predetermined pitch;

(b) optimizing the numerical aperture and partial coherence of the stepper using one of the plurality of patterns on the calibration reticle corresponding to a predetermined pitch value of a semiconductor structure reticle, said optimizing including determining whether a linewidth of the test pattern is optimized and determining corresponding optimum numerical aperture and partial coherence characteristics of the stepper.

2. The method according to claim 1, wherein the semiconductor structure is a backend metal line.

3. The method according to claim 1, wherein the semiconductor structure is an active line.

4. The method according to claim 1, wherein the semiconductor structure is a metal line.

5. The method according to claim 1, wherein the semiconductor structure is a contact hole.

6. The method according to claim 1, wherein the semiconductor structure is an implant layer.

7. The method according to claim 1, wherein step (b) comprises the steps of:

(c) forming a test mask on a test layer using one of the plurality of patterns on the calibration reticle corresponding to a predetermined pitch value of a semiconductor structure reticle; and (d) etching the test layer using the test mask to form a test pattern.

8. The method according to claim 7, further comprising the steps of:

(f) adjusting the numerical aperture and the partial coherence characteristics of the stepper if the linewidth of the test pattern is not optimized; and (g) repeating steps (c) through (f) until the linewidth of the test pattern is optimized.

9. The method according to claim 7, further comprising the steps of:

positioning the semiconductor structure reticle on the stepper;

forming a semiconductor structure mask on a metal layer using the semiconductor structure reticle at the optimum numerical aperture and partial coherence characteristics; and etching the metal layer using the semiconductor structure mask to form a semiconductor structure layer.

10. The method according to claim 1, wherein step (b) comprises the steps of:

forming a matrix of test masks on a test layer using one of the plurality of patterns on the calibration reticle corresponding to a predetermined pitch value of a semiconductor structure reticle, each test mask being formed using different numerical aperture or partial coherence characteristics on the stepper;

etching the test layer using the matrix of test masks to form a corresponding matrix of test patterns; and determining which one of the test patterns has an optimized linewidth and corresponding optimum numerical aperture and partial coherence characteristics of the stepper.

11. The method according to claim 10, further comprising the steps of:

positioning the semiconductor structure reticle on the stepper;

forming a semiconductor structure mask on a metal layer using the semiconductor structure reticle at the optimum numerical aperture and partial coherence characteristics; and etching the metal layer using the semiconductor structure mask to form a semiconductor structure layer.

12. The method according to claim 1, further comprising the step of:

repeating step (b) for each of the plurality of patterns.

13. The method according to claim 1, further comprising the steps of:

positioning the semiconductor structure reticle on the stepper;

forming a semiconductor structure mask on a metal layer using the semiconductor structure reticle at the optimum numerical aperture and partial coherence characteristics; and etching the metal layer using the semiconductor structure mask to form a semiconductor structure layer.

14. A method for preparing a stepper to form semiconductor structure lines by using a calibration reticle to determine optimum numerical aperture and partial coherence values for the stepper, said method comprising the steps of:

(a) positioning a calibration reticle on the stepper, the calibration reticle comprising a plurality of patterns disposed on a light-transmissive substrate, the plurality of patterns each having a different predetermined pitch;

(b) forming a test pattern in a test layer using one of the plurality of patterns on the calibration reticle corresponding to a predetermined pitch value of a semiconductor structure reticle; and (c) optimizing a linewidth of the test pattern by varying the numerical aperture and partial coherence characteristics of the stepper, said optimizing comprising determining whether the linewidth of the test pattern is optimized and determining corresponding optimum numerical aperture and partial coherence characteristics of the stepper.

15. The method according to claim 14, wherein step (b) comprises the steps of:

forming a test mask on the test layer using one of the plurality of patterns on the calibration reticle corresponding to a predetermined pitch value of a semiconductor structure reticle; and etching the test layer using the test mask to form the test pattern.

16. The method according to claim 15, further comprising the steps of:

(d) adjusting the numerical aperture and the partial coherence characteristics of the stepper if the linewidth of the test pattern is not optimized; and (e) repeating steps (b) through (d) until the linewidth of the test pattern is optimized.

17. The method according to claim 16, further comprising the steps of:

positioning the semiconductor structure reticle on the stepper;

forming a semiconductor structure mask on a metal layer using the semiconductor structure reticle at the optimum numerical aperture and partial coherence characteristics; and etching the metal layer using the semiconductor structure mask to form a semiconductor structure layer.

18. The method according to claim 14, wherein step (b) comprises the steps of:

forming a matrix of test masks on the test layer using one of the plurality of patterns on the calibration reticle, each test mask being formed using different numerical aperture or partial coherence characteristics on the stepper; and etching the test layer using the matrix of test masks to form a corresponding matrix of test patterns.

19. The method according to claim 18, wherein step (c) comprises the step of:

determining which one of the test patterns has an optimized linewidth and corresponding optimum numerical aperture and partial coherence characteristics of the stepper.

20. The method according to claim 19, further comprising the steps of:

positioning the semiconductor structure reticle on the stepper;

forming a semiconductor structure mask on a metal layer using the semiconductor structure reticle at the optimum numerical aperture and partial coherence characteristics; and etching the metal layer using the semiconductor structure mask to form a semiconductor structure layer.

21. The method according to claim 14, further comprising the step of:

repeating steps (b) and (c) for each of the plurality of patterns.

22. The method according to claim 14, further comprising the steps of:

positioning the semiconductor structure reticle on the stepper;

forming a semiconductor structure mask on a metal layer using the semiconductor structure reticle at optimum numerical aperture and partial coherence characteristics; and etching the metal layer using the semiconductor structure mask to form a semiconductor structure layer.

* * * * *